United States Patent [19]
Iwase et al.

[11] Patent Number: 5,747,837
[45] Date of Patent: May 5, 1998

[54] SEMICONDUCTOR DEVICE HAVING INPUT PROTECTIVE FUNCTION

[75] Inventors: Akihiro Iwase; Tomio Nakano; Teruo Seki, all of Kasugai, Japan

[73] Assignee: Fujitsu Limited, Kanagawa, Japan

[21] Appl. No.: 763,262

[22] Filed: Dec. 10, 1996

[30]      Foreign Application Priority Data

Dec. 12, 1995   [JP]   Japan ................................ 7-323006

[51] Int. Cl.$^6$ ................................................ H01L 27/06
[52] U.S. Cl. .......................... 257/173; 257/355; 257/566; 257/575; 257/557; 257/560; 257/563
[58] Field of Search ................................. 257/173, 355, 257/566, 515, 557, 560, 563

[56]              References Cited

U.S. PATENT DOCUMENTS 5,373,179   12/1994   Matsui et al. ........................... 257/355

FOREIGN PATENT DOCUMENTS 61-154060   7/1986   Japan ................................. 257/566
63-220564   9/1988   Japan .

OTHER PUBLICATIONS

*Microelectronics*, Second Edition McGraw–Hill Book Company, 1988 "Large Signal Diode Models", pp. 52–53 pnp Fabrication, pp. 184–185.

Primary Examiner—Tom Thomas
Assistant Examiner—David B. Hardy
Attorney, Agent, or Firm—Nikaido Marmelstein Murray & Oram, LLP

[57]                ABSTRACT

A semiconductor device with an expanded range of a recommended condition for an input voltage is disclosed. In embodiment, the semiconductor device having input protection on an input terminal thereto, includes: a semiconductor region having a first conducting type, first and second diffusion regions defined in the semiconductor region and respectively having a second conducting type, and a transistor formed by using the semiconductor region as a base, the first diffusion region as a collector, and the second diffusion region as an emitter. The first diffusion region is connected to one of a high-potential power supply and a low-potential power supply, the second diffusion region is connected to the input terminal, and the semiconductor region is connected to another power supply having a voltage high enough to reverse bias the junction between the semiconductor region and the first diffusion region.

5 Claims, 2 Drawing Sheets

SEMICONDUCTOR DEVICE HAVING INPUT PROTECTIVE FUNCTION

BACKGROUND OF THE INVENTION

1. Field of the Invention

The present invention relates to a semiconductor device, and more particularly, to a semiconductor device having an input protective function.

2. Description of the Related Art

To increase density and integration, transistor elements of a semiconductor device are fabricated to be very fine (small) and to have a thin gate-insulating film. As a result, the voltage a gate can withstand tends to be lower. A semiconductor device having such fine transistor elements is provided with an input protection circuit for preventing electrostatic breakdown.

Japanese Unexamined Patent Publication No. 63-220564 discloses a CMOS-LSI circuit having an input protection circuit comprising a pnp-type lateral transistor and an npn-type lateral transistor. The lateral pnp transistor has a collector connected to a high-potential power supply ($V_{cc}$), an emitter connected to an input terminal of a semiconductor device, and a base connected to the high-potential power supply ($V_{cc}$). The lateral npn transistor has a collector connected to a ground ($V_{ss}$), an emitter connected to the input terminal, and a base connected to the ground ($V_{ss}$).

When a surge due to positive static electricity is applied to the input terminal of the semiconductor device, the lateral pnp transistor is turned on and the surge is discharged to the high-potential power supply ($V_{cc}$). Consequently, a high voltage electrostatic surge is prevented from being applied to internal circuits of the semiconductor device. When a surge due to negative static electricity is applied to the input terminal, the lateral npn transistor is turned on, a current flows from the ground ($V_{ss}$) to the input terminal, and the surge disappears. Accordingly, a low voltage electrostatic surge is prevented from being applied to internal circuits of the semiconductor device.

However, because the bases of the both lateral transistors of the input protection circuit are connected to the high-potential power supply and the ground, respectively, the lateral npn transistor also turns on when an input signal having, for example, a voltage of $-1.5$ V is applied to the input terminal. This, however, limits the range of a recommended operating condition for a low-potential-side voltage of the input signal. When an input signal having, for example, a voltage of $+5.5$ V is applied and a high-potential power supply ($V_{cc}$) of 3 V is used, the lateral pnp transistor is turned on. This limits the expansion of a recommended operating condition for a high-potential-side voltage of the input signal. The resulting limitation on the recommended operating conditions for the low-potential-side voltage and the high-potential-side voltage also limit the allowable range of an undershoot or overshoot.

SUMMARY OF THE INVENTION

Broadly speaking, the present invention relates to a semiconductor device with an expanded voltage range of a recommended condition for an input voltage.

The present invention can be implemented in numerous ways, including as an apparatus and method. Several of the embodiments are invention are discussed below.

As a semiconductor device having input protection on an input terminal thereto, with the semiconductor device being coupled to a high-potential power supply ($V_{cc}$) and a low-potential power supply ($V_{ss}$), an embodiment of the invention includes: a semiconductor region having a first conducting type; first and second diffusion regions defined in the semiconductor region and respectively having a second conducting type; and a transistor formed by using the semiconductor region as a base, the first diffusion region as a collector, and the second diffusion region as an emitter. The first diffusion region is connected to one of the high-potential power supply and the low-potential power supply, the second diffusion region is connected to the input terminal, and the semiconductor region is connected to another power supply $V_{pp}$ or VBR) having a voltage high enough to reverse bias the junction between the semiconductor region and the first diffusion region.

As a semiconductor device having input protection on an input terminal thereto, with the semiconductor device being coupled to a high-potential power supply ($V_{cc}$) and a low-potential power supply ($V_{ss}$), another embodiment of the invention includes a semiconductor region having a first conducting type; first and second diffusion regions defined in the semiconductor region and respectively having a second conducting type; and a transistor formed by using the semiconductor region as a base, the first diffusion region as a collector, and the second diffusion region as an emitter. The first diffusion region is connected to one of the high-potential power supply and the low-potential power supply, the second diffusion region is connected to the input terminal, and the semiconductor region is connected to one of the third power supply ($V_{pp}$) having a voltage higher than the voltage of the high-potential power supply and the fourth power supply having a voltage lower than the low-potential power supply.

As a semiconductor device having input protection on an input terminal thereto, with the semiconductor device being coupled to a high-potential power supply ($V_{cc}$) and a low-potential power supply ($V_{ss}$), still another embodiment of the invention includes a semiconductor substrate having a first conducting type; a first semiconductor region defined in the semiconductor substrate and having a second conducting type, the second conducting type being different from the first conducting type; first and second diffusion regions defined in a part of the first semiconductor region and respectively having the first conducting type; a first transistor formed by using the first semiconductor region as a base, the first diffusion region as a collector, and the second diffusion region as an emitter; a second semiconductor region defined in another part of the first semiconductor region and having the first conducting type; third and fourth diffusion regions defined in the second semiconductor region and respectively having the second conducting type; and a second transistor formed by using the second semiconductor region as a base, the third diffusion region as a collector, and the fourth diffusion region as an emitter. The first and third diffusion regions are connected to one of the high-potential power supply and the low-potential power supply, the second and fourth diffusion regions are connected to the input terminal, the first semiconductor region is connected to a third power supply ($V_{pp}$) having a voltage high enough to reverse bias the junction between the first semiconductor region and the second diffusion region, and the second semiconductor region is connected to a fourth power supply ($V_{BB}$) having a voltage high enough to reverse bias the junction between the second semiconductor region and the fourth diffusion region.

As a semiconductor device having input protection on an input terminal thereto, with the semiconductor device being coupled to a high-potential power supply ($V_{cc}$) and a low-potential power supply (Vss), yet another embodiment of the invention includes a semiconductor substrate having a first conducting type; a first semiconductor region defined in the semiconductor substrate and having a second conducting type, the second conducting type being different from the first conducting type; first and second diffusion regions defined in a part of the first semiconductor region and respectively having the first conducting type; a first transistor formed by using the first semiconductor region as a base, the first diffusion region as a collector, and the second diffusion region as an emitter; a second semiconductor region defined in another part of the first semiconductor region and having the first conducting type; third and fourth diffusion regions defined in the second semiconductor region and respectively having the second conducting type; and a second transistor formed by using the second semiconductor region as a base, the third diffusion region as a collector, and the fourth diffusion region as an emitter. The first and third diffusion regions are connected to one of the high-potential-power supply and the low-potential power supply, the second and fourth diffusion regions are connected to the input terminal, the first semiconductor region is connected to a third power supply (Vpp) having a voltage higher than the voltage of the high-potential power supply, and the second semiconductor region is connected to a fourth power supply (Vpp) having a voltage lower than the voltage of the low-potential power supply.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with advantages thereof, may be understood by reference to the following description together with the accompanying drawings, in which.

DETAILED DESCRIPTION OF THE PREFERRED EMBODIMENTS

Figure 1:
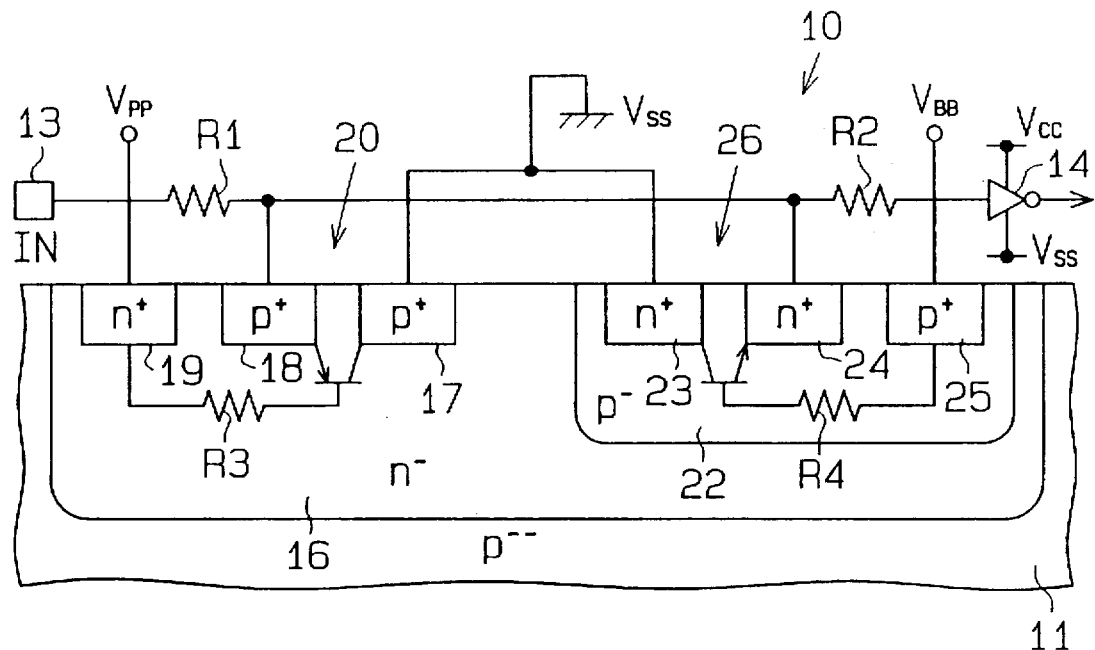
FIG. 1 is a schematic sectional view illustrating a semiconductor device having an input protective function according to an embodiment of the present invention.

A semiconductor device of an embodiment of the present invention is described below by referring to the accompanying drawings. FIG. 1 is a schematic sectional view illustrating a semiconductor device having an input protective function according to an embodiment of the present invention. As shown in FIG. 1, a semiconductor device (protection circuit) 1.0 provided with an input protective function is formed on a $p^-$-semiconductor substrate 11. The semiconductor device 10 receives power from an operating power supply comprising a high-potential power supply Vcc (first power supply) and a ground Vss as a low-potential power supply (second power supply).

A CMOS inverter 14 as an internal circuit is connected to the semiconductor device 10. The CMOS inverter 14 receives power from the power supply Vcc and the ground Vss and operates in response to an input signal IN input through an input terminal 13 of the semiconductor device 10. The CMOS inverter 14 has an input terminal connected to the input terminal 13 through wiring, and an output terminal for outputting a signal. to which the voltage level of the input signal IN is reversed. The wiring includes parasitic resistances R1 and R2.

An $n^-$-type well region ($n^-$-type semiconductor region) 16 is defined in the $p^+$-type semiconductor substrate 11. First and second $p^+$-type diffusion regions 17 and 18 and an $n^-$-type diffusion region 19 for a contact are defined on a part of the surface of the $n^-$-type well region 16 in the lateral direction. A lateral pnp transistor 20 is formed by using the first $p^+$-type diffusion region 17 as a collector, the second $p^+$-type diffusion region 18 as an emitter, and the $n^-$-type well region as a base. The $n^-$-type well region 1–6 is connected to an $n^-$-type diffusion region 19 through a parasitic resistance R3 of the region 16.

The first $p^+$-type diffusion region 17 is connected to the ground Vss. The second $p^+$-type diffusion region 16 is connected to the input terminal 13 through the parasitic resistance Ri. The $n^-$-type diffusion region 19 is connected to a third power supply Vpp having a voltage higher than that of the high-potential power supply Vcc. With this device arrangement and connections, the pn junction between the $n^-$-type well region 16 and the first $p^+$-type diffusion region 17 is reversed biased.

A $p^-$-type well region ($p^-$-type semiconductor region) 22 is defined on another part of the surface of the $n^-$-type well region 16. First and second $n^-$-type diffusion regions 23 and 24 and a $p^+$-type diffusion region 25 for a contact are defined on the surface of the $p^-$-type well region 22 in the lateral direction. A lateral npn transistor 26 is formed by using the first $n^-$-type diffusion region 23 as a collector, the second $n^-$-type diffusion region 24 as an emitter, and the $p^-$-type well region 22 as a base. The $p^-$-type well region 22 is connected with the $p^+$-type diffusion region 25 through a parasitic resistance R4 of the region 22.

The first $n^-$-type diffusion region 23 is connected to the ground Vss. The second $n^-$-type diffusion region 24 is connected to the input terminal 13 through the parasitic resistance R1. The $p^+$-type diffusion region 25 is connected to a fourth power supply $V_{BB}$ having a voltage lower than that of the ground Vss. With this device arrangement and. connections, the pn junction between the $p^-$-type well region 22 and the first $n^-$-type diffusion region 23 is reversed biased. In this embodiment, the voltage of the third power supply Vpp is set to +5.0 V (volt) and that of the fourth power supply VBB is set to −1.5 V.

Figure 2:
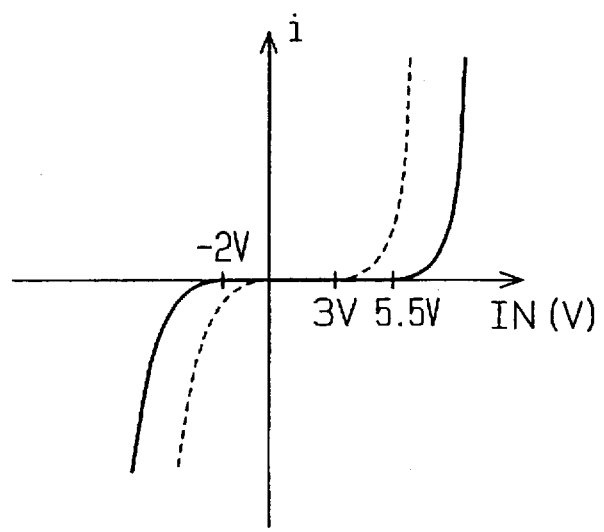
FIG. 2 is a graph illustrating the relationship between the voltage of an input signal supplied to the semiconductor device in FIG. 1 and the current passing through the semiconductor device.

As shown in FIG. 2, assume that the input signal IN having a voltage of +5.5 V is supplied to the input terminal 13 of the semiconductor device 10. In this case, a voltage of +5.0 V (voltage of the power supply Vpp) is applied to the $n^-$-type well region 16 (base) of the lateral pnp transistor 20. Here, assume that a voltage drop at the pn junction between the second $p^+$-type diffusion region 18 and the $n^-$-type well region 16 in the forward direction is +0.5 V. In this case, the pn junction does not become forward biased, and consequently the lateral pnp transistor 20 is not turned on.

Then, as shown in FIG. 2, assume that the input signal IN having a voltage of −2.0 V is supplied to the input terminal 13 of the semiconductor device 10. In this case, a voltage of −1.5 V (voltage of the power supply VBB) is applied to the $p^-$-type well region 22 (base) of a lateral npn transistor 26. Here, assume that a voltage drop at the pn junction between the $p^-$-type well region 22 and the second $n^+$-type diffusion region 24 in the forward direction is +0.5 V. In this case, the pn junction does not become forward biased. As a result, the lateral npn transistor 26 is not turned on.

Therefore, the CMOS inverter 14 outputs a signal in which the voltage level of the input signal IN is reversed in response to the input signal IN having a voltage in a range of +5.5 V to −2.0 V.

When the input signal IN having a voltage higher than +5.5 V is supplied to the input terminal 13, the lateral pnp transistor 20 is turned on. Then, a current flows from the input terminal 13 to the ground Vss through the pnp transistor 20. Thus, a voltage of the input signal IN that is higher than +5.5 V is prevented from being applied to the CMOS inverter 14.

When the input signal IN having a voltage low (i.e., more negative) than −2.0 V is applied to the input terminal 13, the lateral npn transistor 26 is turned on. Then, a current flows from the ground Vss to the input terminal 13 through the npn transistor 26. Thus, a voltage of the input signal IN that is lower than −2.0 V is prevented from being applied to the CMOS inverter 14.

As described above, the base of the lateral pnp transistor 20 is connected to the power supply $V_{PP}$ having a voltage higher than that of the high-potential power supply $V_{cc}$. Therefore, the lateral pnp transistor 20 is turned on only when an input signal having a high voltage exceeding 45.5 V is supplied. In other words, the on-voltage of the lateral pnp transistor 20 is raised. The invention thus allows the range of a recommended operating condition for a high-potential-side voltage to the input signal IN to be expanded.

Moreover, the base of the lateral npn transistor 26 is connected to the power supply $V_{BB}$ having a voltage lower than the ground Vss. Therefore, the lateral npn transistor 26 is turned on only when the input signal IN having a voltage lower than −2.0 V is supplied. In other words, on-voltage of the lateral npn transistor 26 lowered. The invention thus allows the range of the recommended operating condition for a low-potential-side voltage to the input signal IN to be expanded.

Although only one embodiment of the present invention has been described herein, it should be apparent to those ski-led in the art that the present invention may be embodied in many other specific forms without departing from the spirit or scope of the invention. Particularly, it should be understood that the invention may be embodied in the following forms. An $n^{--}$-type semiconductor substrate may be used instead of the $p^+$-type semiconductor substrate 11. In this case, regions 16 to 19 and 22 to 25 have a conducting type different from that of the above embodiment. That is, a $p^-$-type well region is defined in an $n^{--}$-type semiconductor substrate, and moreover, an $n^-$-type well region is defined in the $p^-$-type well region.

It is possible to use a semiconductor device having only one of the lateral pnp transistor 20 and the lateral npn transistor 26. For example, when only the lateral pnp transistor 20 is used, the range of a recommended operating condition for a high-potential-side voltage to the input signal IN is expanded. When only the lateral npn transistor 26 is used, the range of a recommended operating condition for a low-potential-side voltage to the input signal IN is expanded.

Figure 3:
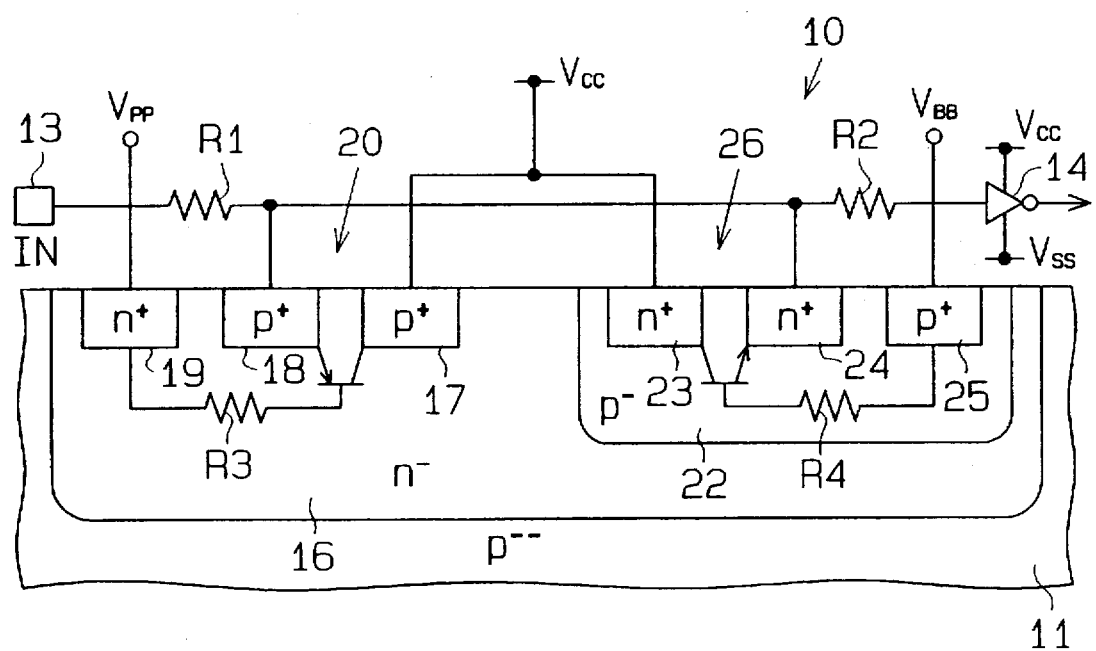
FIG. 3 is a schematic sectional view illustrating a semiconductor device having an input protective function according to another embodiment of the present invention.

FIG. 3 is a schematic sectional view illustrating a semiconductor device having an input protective function according to another embodiment of the present invention. As shown in FIG. 3, the first $p^+$-type diffusion region 17 (collector) of the lateral pnp transistor 20 and the first $n^{30}$-type diffusion region 23 (collector) of the lateral npn transistor 26 are connected to the power supply Vcc instead of the ground Vss. Here, the power supply Vcc absorbs any surges on the input signal IN beyond the expanded range a recommended condition for an input voltage.

Therefore, the present examples and embodiment are to be considered as illustrative and not restrictive and the invention is not to be limited to the details given herein, but may be modified within the scope and equivalence of the appended claims.

What is claimed is:

1. A semiconductor device having input protection on an input terminal thereto, said semiconductor device being coupled to a high-potential power supply and a low-potential power supply, said semiconductor device comprising:

a semiconductor substrate having a first conducting type;

a first semiconductor region defined in said semiconductor substrate and having a second conducting type, said second conducting type being different from said first conducting type;

first and second diffusion regions defined in a part of said first semiconductor region and respectively having said first conducting type;

a first transistor formed by using said first semiconductor region as a base, said first diffusion region as a collector, and said second diffusion region as an emitter;

a second semiconductor region defined in another part of said first semiconductor region and having said first conducting type;

third and fourth diffusion regions defined in said second semiconductor region and respectively having said second conducting type; and a second transistor formed by using said second semiconductor region as a base, said third diffusion region as a collector, and said fourth diffusion region as an emitter;

wherein said first and third diffusion regions are connected to one of said high-potential power supply and said low-potential power supply, said second and fourth diffusion regions are connected to said input terminal, said first semiconductor region is connected to a third power supply having a voltage higher than the voltage of said high-potential power supply, and said second semiconductor region is connected to a fourth power supply having a voltage lower than the voltage of said low-potential power supply.

2. The semiconductor device according to claim 1, wherein said first conducting type is p-type, said second conducting type is n-type, said first transistor is a pnp transistor, and said second transistor is an npn transistor.

3. The semiconductor device according to claim 1, wherein said semiconductor device further comprises:

a first base diffusion region defined in said first semiconductor region and having the second conducting type; and a second base diffusion region defined in said second semiconductor region and having the first conducting type, and wherein the base of said first transistor is formed by said first base diffusion region, and the base of said second transistor is formed by said second base diffusion region.

4. An input protection circuit comprising:

an input terminal for providing an input signal to an internal circuit;

a low-potential power supply line;

a lateral NPN transistor having a collector connected to said low-potential power supply line and an emitter connected to the input terminal, wherein a base of the lateral NPN transistor is connected to a potential which is lower than that of the low-potential power supply line;

a high-potential power supply line; and a lateral PNP transistor having a collector connected to said high-potential power supply line and an emitter connected to the input terminal, wherein a base of the lateral PNP transistor is connected to a potential which is higher than that of the high-potential power supply line.

5. An input protection circuit comprising:

an input terminal for providing an input signal to an internal circuit;

a power supply line;

a lateral NPN transistor having a collector connected to said power supply line and an emitter connected to the input terminal, wherein a base of the lateral NPN transistor is connected to a potential which is lower than that of the power supply line; and a lateral PNP transistor having a collector connected to said power supply line and an emitter connected to the input terminal, wherein a base of the lateral PNP transistor is connected to a potential which is higher than that of the power supply line.

* * * * *